United States Patent [19]

Westerberg et al.

[11] Patent Number: 4,465,934
[45] Date of Patent: Aug. 14, 1984

[54] PARALLEL CHARGED PARTICLE BEAM EXPOSURE SYSTEM

[75] Inventors: Eugene R. Westerberg; Ivor Brodie, both of Palo Alto, Calif.

[73] Assignee: Veeco Instruments Inc., Melville, N.Y.

[21] Appl. No.: 348,154

[22] Filed: Feb. 11, 1982

Related U.S. Application Data

[63] Continuation of Ser. No. 227,620, Jan. 23, 1981, abandoned.

[51] Int. Cl.³ .............................................. H01J 37/00
[52] U.S. Cl. .................................. 250/398; 250/452.2
[58] Field of Search ......... 250/452.2, 396 R, 396 ML, 250/398

[56] References Cited

U.S. PATENT DOCUMENTS

| | | | |
|---|---|---|---|
| 3,491,236 | 1/1970 | Newberry | 250/307 |
| 3,519,873 | 7/1970 | O'Keeffe | 250/452.2 |
| 3,614,423 | 10/1971 | Heynick | 250/452.2 |
| 3,619,608 | 11/1971 | Westerberg | 250/452.2 |
| 3,715,580 | 2/1973 | Mackawa et al. | 250/452.2 |
| 3,717,785 | 2/1973 | Guernet | 250/396 R |
| 3,745,358 | 7/1973 | Firtz et al. | 250/397 |
| 3,900,737 | 8/1975 | Collier et al. | 250/452.2 |
| 3,999,097 | 12/1976 | Ko et al. | 250/452.2 |
| 4,110,623 | 8/1978 | Azann et al. | 250/398 |
| 4,153,843 | 5/1979 | Pease | 250/452.2 |
| 4,200,794 | 4/1980 | Newberry | 250/396 ML |
| 4,214,162 | 7/1980 | Hoppe et al. | 250/396 ML |
| 4,390,789 | 6/1983 | Smith | 250/452.2 |

OTHER PUBLICATIONS

"Electron Beam Lithography Creates World's Smallest Man-Made Object" *Pen*, vol. 4, No. 18, 7-74, pp. 1-2.
"BES: A Practical Electron Lithrahic System", *IEEE Trans.*, Herriott et al., vol. ED-22, No. 7, 7-75, pp. 385-392.
"Projection Electron Lithography using Aperature Lenses", *IEEE Trans.*, Heynick et al., vol. ED-22, No. 7, 7-75, pp. 355-409.

*Primary Examiner*—Bruce C. Anderson
*Attorney, Agent, or Firm*—Morgan, Finnegan, Pine, Foley & Lee

[57] ABSTRACT

A parallel exposure electron beam lithography system for directly writing an integrated circuit pattern simultaneously at a plurality of locations on the surface of a resist-coated semiconductor wafer is disclosed.

An electron source produces an electron beam which is used to illuminate an object aperture. A screen lens consisting of a multiplicity of holes breaks up the flood electron beam emanating from the object aperture into a multiplicity of beams in parallel and focuses them on a resist-coated substrate. Each hole in the screen lens acts like a small aperture lens when a positive potential is applied to the wafer with respect to the screen lens.

A pair of octupole deflectors electronically control the angle with which the electron beam strikes the screen lens. This controls the deflection of the images beneath each of the screen lenses. An interferometer-controlled stage moves in a direction orthogonal to the direction of beam deflection and, in conjunction with the synchronous blanking of the flood electron beam, effectively scans out a predetermined integrated circuit pattern under each lens.

Alternatively, an ion source may be used with an ion-sensitive resist coated substrate or ions may be implanted directly into a substrate.

31 Claims, 2 Drawing Figures

PARALLEL CHARGED PARTICLE BEAM EXPOSURE SYSTEM

BACKGROUND OF THE INVENTION

This invention relates to the field of electron beam lithography systems, and more particularly to an exposure system for a multiple electron beam lithography system.

As integrated circuits become more complex there is a general trend in the semiconductor industry toward increasing device packaging density. The present philosophy is to keep chip or die sizes as small as possible, and so increase device yield. However, it is obvious that chip size cannot be arbitrarily reduced because of the inherent resolution limits of presently-used photolithographic processes. In particular, the wavelength of light imposes a barrier to the reproduction of detail in the region of one micron.

A number of solutions have been proposed to solve the resolution problem and there is considerable activity in this area presently underway in the semiconductor industry. These solutions are based on lithographic techniques that employ particles of shorter wavelengths than visible light to overcome the resolution limitation. Generally, two classes of short wavelength particles have been proposed as alternatives to light, i.e., high energy photons (X-rays) and electrons.

The currently known lithographic systems are either ased on the use of X-rays or electron beams. There are two basic types of electron beam systems. One type of electron beam system uses modified scanning electron microscope techniques and the other uses projection techniques.

An optimal lithographic exposure system would have to possess certain attributes in order for it to be a serious contender for use in the production of integrated circuits. These attributes include resolution, coverage, lithographic speed, reregistration and stability.

At present, minimum reproducible line widths of 1 micron are mandatory, and future integrated circuit structures will probably push the desired system resolution requirements to below ¼ micron. The exposure system should be capable of covering the standard 3" and/or 4" wafers presently used in industry and be expandable to cover the larger sized wafers being contemplated. Clearly wafer exposure times measured in tens of minutes to hours are not acceptable in production exposure systems. Acceptable throughput conditions demand full 3" and/or 4" wafer exposure times of at most a few minutes.

The multilayer structure of integrated circuits necessitates that there be a reregistration mechanism built into the exposure system. In general, reregistration capabilities should be a minimum of a factor of five times better than the size of the smallest detail required. Another consequence of multilayer structure necessitates that even with an acceptable reregistration scheme, the lithographic system should be stable during the exposure period so that the registration will remain precise over the entire surface of the wafer.

Comparing the three known lithographic techniques noted above, the X-ray system has been demonstrated to have more than enough resolution; however, exposure times are still on the order of tens of minutes. Furthermore, no completely acceptable reregistration method seems to exist for X-rays at the moment. Stability is also a problem with X-ray systems because the masks that are used are essentially thin pellicles of material (mylar or silicon) which are temperature and pressure sensitive. Finally, although coverage of areas about 2" in diameter have been demonstrated, expansion to larger areas appears to present formidable difficulties.

Scanning electron beam methods have fewer limitations than the projection systems. Scanning systems have been demonstrated with the necessary resolution, coverage, stability, and reregistration capabilities. The main problem appears to be one of exposure time. For example, some current exposure systems take approximately 60 minutes to expose a 3" wafer. Although this time is adequate for mask production, it is far from being useful for use in direct write on-line production systems. Present research indicates that with improved electron guns and more sensitive electron resists the exposure times may be reduced to less than about 15 minutes. However, exposure times in the range of 2 to 3 minutes will be needed for production-oriented systems.

The most promising lithographic technique seems to be the scanning electron beam system provided the limitation of long exposure time can be overcome. The potential usefulness of the scanned electron beam technique is more apparent when it is noted that both X-ray and electron projection techniques require a high resolution mask and this mask must initially be made by a scanning electron beam system. Finally, there is the additional advantage of scanning systems that the master "mask" exists as data stored on tape or disc where it can be easily and rapidly updated. This capability eliminates the need for a physical mask and thus avoids any problems attributable to wear and subsequent deterioration of the mask.

A multiple image electron beam exposure system has been suggested by Westerberg, in U.S. Pat. No. 3,619,608, wherein an array of electron lenses is used to produce an array of closely spaced demagnified images of an aperture mask on a target surface without requiring physical displacement. The array of patterns is therefore written faster by a function directly related to the number of lenses. However, it should be apparent that certain inherent limitations of the disclosed system would preclude its effective use in connection with production equipment. In particular the small field of view of usable beam deflection, before the onset of electron optical aberrations, would limit the effective die size to an area far smaller than that required for integrated circuit purposes.

It is accordingly a general object of the present invention to overcome the aforementioned limitations and drawbacks associated with known systems and to fulfill the needs mentioned by providing an exposure system for a charged particle beam lithography system having all of the desirable attributes noted above.

It is a particular object of the invention to provide a high resolution exposure system having a high throughput capability.

It is a further object of the invention to provide an exposure system for a multiple charged particle beam lithography system for utilization in the production of integrated circuits.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as a multiple image exposure system comprising: an exposure beam directed along a path; means for selectively blanking said exposure beam; screen lens means placed in the path of said exposure beam and having a multiplicity of openings formed therein whereby each of said openings of said screen lens means acts as a lens for focusing a demagnified image of said exposure beam onto a target surface positioned adjacent said screen lens means; and deflection means disposed along the path of said exposure beam for deflecting said exposure beam in a predetermined manner.

BRIEF DESCRIPTION OF THE DRAWINGS

Serving to illustrate an exemplary embodiment of the invention are the drawings of which.

DETAILED DESCRIPTION OF THE PREFERRED EMBODIMENT

Figure 1:
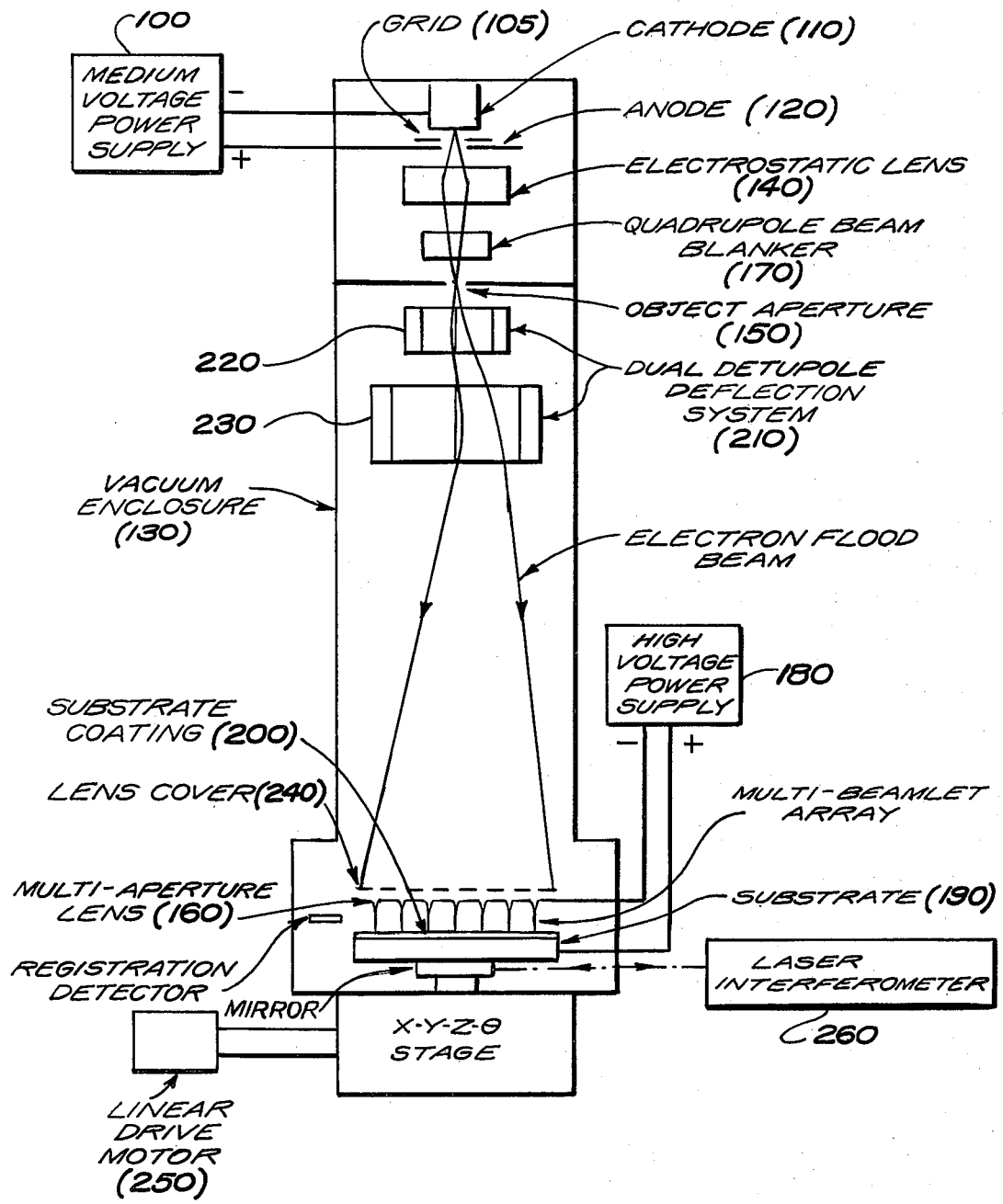
FIG. 1 is a block diagram of the multiple image exposure system of the present invention.

A block diagram of the parallel exposure electron eam lithography system is illustrated in FIG. 1. As shown therein, a medium-voltage power supply 100 is connected between carburized thoriated tunsten cathode 110 and a circular apertured anode 120 which are disposed within a vacuum chamber 130. Interposed between them is a circular apertured control grid 105. The vacuum chamber 130 may be any of the well-known vacuum enclosures which may be evacuated, for example to $10^{-7}$ Torr, and the thoriated tungsten cathode 110 is typically 0.020 inch diameter.

The beam of electrons emitted by cathods 110 passes through anode 120 and is focused by a conventional electrostatic lens 140 onto an object aperture 150. The object aperture 150 contains a predetermined aperture pattern consisting of a 50 μm sided square which is to be reproduced and demagnified. The object aperture 150 is located at the focal point of electrostatic lens 140. This positioning ensures that the cones of electrons passing through the object aperture 150 overlap at the multi-aperture screen lens 160 to produce an even illumination.

The exposure beam, i.e., electron flood beam, that emerges from the object aperture 150 preferably should have a wide angle of illumination (~6°) and a very uniform distribution of current (deviation of >10% across the beam). The use of a real aperture as an object as opposed to an electron beam crossover produces a uniformly intense, sharp edged, square image rather than the circularly symmetrical Gaussian intensity distribution of a crossover. Applying a potential to the quadrupole beam blanker 170 located between the electrostatic lens 140 and the object aperture 150 permits the electron beam to be selectively blanked on and off in accordance with the desired integrated circuit pattern.

A high-voltage power supply 180 (on the order of 10 Kv.) is connected between the multi-aperture screen lens 160 and the substrate 190. The substrate 190 has a target surface or coating 200 of electron-sensitive resist.

As explained in more detail in the aforementioned Westerberg patent, the multi-aperture screen-lens 160 breaks up the flood electron beam emanating from the object aperture 150 into a multiplicity of beams in parallel and focuses them into the resist-coated substrate 200, or on the substrate 190 if a resist is not used. Each hole in the multi-aperture screen lens 160 acts like a small aperture lens when a positive potential is applied to the target surface 200 with respect to the screen lens. Focus is attained when the target surface potential is 8 to 9 times the energy of the arriving electron beam. The exact ratio depends on lens characteristics, such as diameter, but is relatively independent of the spacing between the multi-aperture screen lens 160 and the target surface 200. This property is useful because it effectively means that screen lenses have a very large depth of focus.

The multi-aperture screen lens 160 utilized in the present invention is made up of 2 plates of aligned holes. The smaller holes, typically 0.05 cm to 0.075 cm diameter, face the electron flood beam and serve as apertures to control the image aberrations. The larger set of holes (typically 0.15 cm dia.) are influenced by the electric field between the multi-aperture screen lens 160 and the substrate 190 to form the embodiment of most of the lens action.

The area between the multi-aperture screen lens 160 and the substrate holding stage (not shown) is surrounded by a set of guard rings (not shown) which serve to make the field between the screen lens and substrate look like it is infinite in extent so that the actions of the holes on the periphery of the screen lens are not modified by their environment. Each of the guard rings consists of an electrically conductive annular ring with a typical inside diameter of 8 inches. A number of such guard rings are stacked on top of each other and separated by insulating spacers. A typical assembled configuration for a 2 cm screen lens - substrate gap and an applied voltage of 10 kv would be 9 such guard rings having a 2 mm spacing between each. A uniformly graded voltage would be applied to each ring; in the above case the rings would have applied voltages of 1, 2, 3 kv etc. By this means, a highly uniform electric field can be obtained in the region between the screen lens and the substrate.

A dual octupole deflection system 210 consisting of a top octupole 220 and a bottom octupole 230 is used to deflect, by predetermined amounts and directions, the electron flood beam passing through object aperture 150 and illuminating the multi-aperture screen lens 160.

Figure 2:
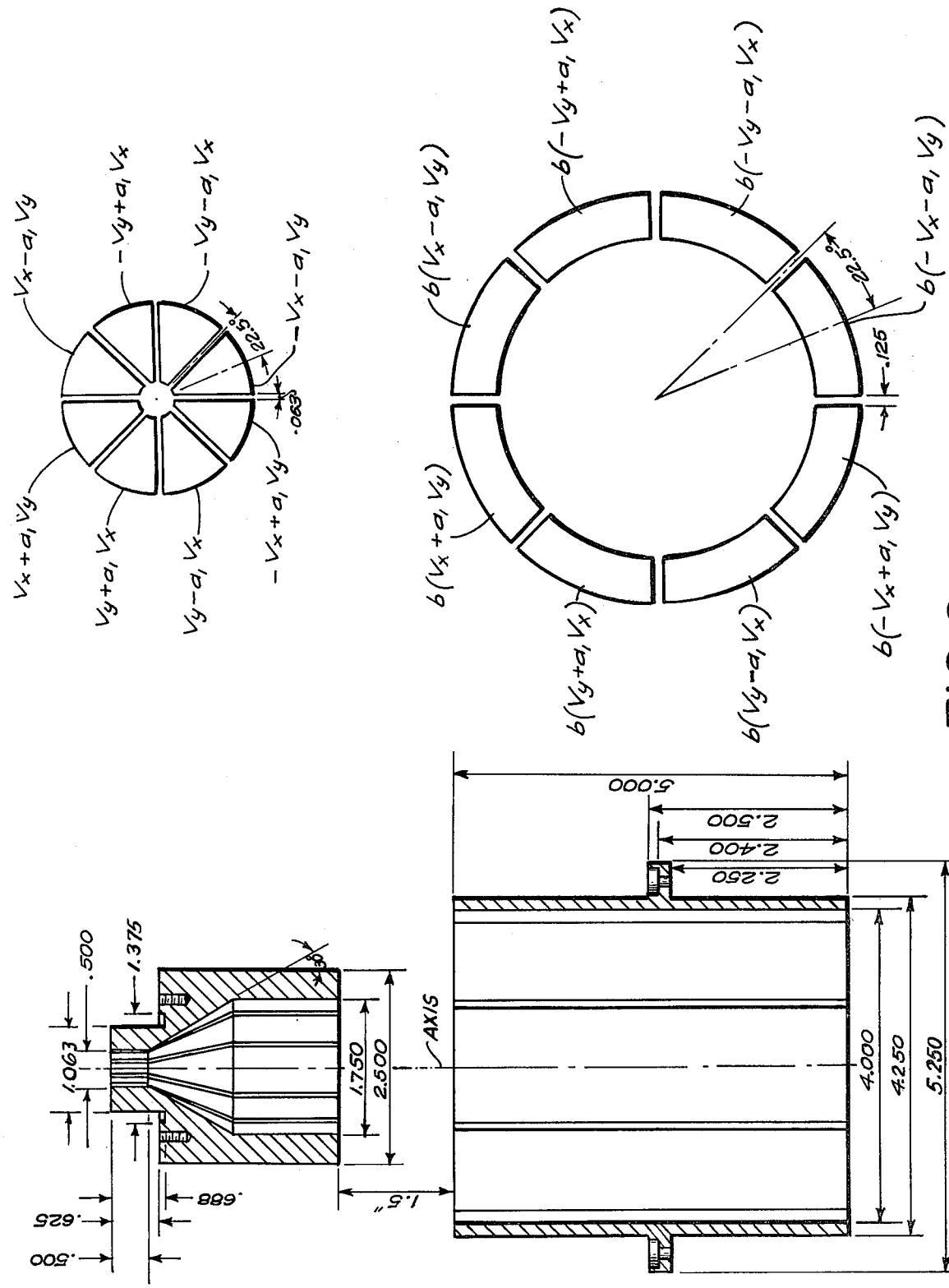
FIG. 2 is a schematic diagram of the double octupole system showing the compensating signals to be added or subtracted to the primary signals for each pole of the double octupole deflection system.

The voltages applied to each pole of the dual octupole system 210 are generated in an arrangement of driver circuits. Upon instruction, voltages $V_x$ and $V_y$ are generated, corresponding to required deflections of the focused spots of x and y in each of two orthogonal directions. These voltages are combined in the driver circuits with predetermined multiplier coefficients $a_1$, $a_2$, and b in various ways to supply each of the poles of the double octupole system with voltages as shown in FIG. 2. This is easily accomplished using conventional electronic circuit methods. Coefficients $a_1$, $a_2$, are used to compensate for deflection positional errors from center to edge of the screen lens, i.e., by adjusting the values of $a_1$ and $a_2$ it is possible to compensate for the aberrations of the deflector-screen lens combination so that scans of equal length with a precision of ±0.1 μm can be obtained over the entire substrate 190. The optimum values of $a_1$ and $a_2$ may be determined phenomenologically by measuring pattern stitching errors across a substrate as a function of the values of $a_1$ and $a_2$. This condition assures that images at the target surface 200 are properly stitched together with no gaps or overwriting. In the preferred embodiment it has been determined that optimized a values occur in the region of $0.275 > a_1 > 0.375$ for the top octupole 229 and $0.35 > a_2 > 0.45$ for the bottom octupole 230.

Referring again to FIG. 1, the two octupole deflectors 220, 230 bend the flood electron beam to opposing angles so that the angle that the beam strikes the multi-aperture screen lens 160 is electronically controlled. This in turn controls the deflection of the images beneath each of the screen lenses. Thus by adjusting the deflection sensitivity of the two octupole deflectors 220, 230 with respect to one another the exposure beam position at the plane of the multi-aperture screen lens 160 can be made independent of the deflection of the screen lens images. This determines the value of the coefficient b used in the driver circuits described above.

The electron flood beam emerges from the 50 $\mu$m sided square object aperture 150 and drifts through a distance of approximately 100 cm at an energy of 1 keV until it strikes the multi-aperture screen lens 160 positioned above the substrate 190. On reaching the multi-aperture screen lens 160, the electron flood beam has a diameter of approximately 100 mm and a current uniformity over its entire area better than $\pm 10\%$. The latter is determined primarily by the condition of the cathode 110 and its prior treatment. For example, if the cathode tip is not geometrically smooth and cylindrically symmetric, or if the current emission is not uniform from the tip, the flood beam uniformity will be adversely affected.

Most of the electron beam energy is absorbed by a lens plate cover 240 which permits only a small fraction of the incident exposure beam to strike the multi-aperture screen lens 160 or pass through its several apertures. By this means, thermal expansion of the multi-aperture screen lens 160 is minimized during writing. The lens plate may also be used to allow only selected apertures to be open for the purposes of making separate test patterns, and reregistration.

Magnetic shielding of the flood beam during its traverse is accomplished by two layers of mu-metal inside a vacuum chamber which has 0.500 inch-thick, plated, steel walls. The two layers of mu-metal form concentric cylinders mounted symmetrically within the cylindrical vacuum chamber and are supported and separated from each other by means of non-magnetic pins. The steel-walled vacuum chamber is degaussed before use to minimize residual magnetic fields which have a deleterious effect on the flood beam.

Substrate motion over the desired chip area is accomplished by interferometer-controlled stage located outside of the vacuum chamber 130. Motion is achieved by motor-driven air bearings, and is transmitted to the substrate holder (not shown) in the vacuum chamber 130 via a bellows feedthrough.

Stage motion in the X and Y axis need only be large enough to cover a die and is typically limited to $\pm 0.375$ in. since all chips on the substrate 190, with the exception of test patterns, are exposed simultaneously. Rotational and Z motion of the stage is provided for purposes of reregistration.

The stage moves on air bearings (not shown) and is driven by two conventional linear, voice coil motors 250 which are powered and controlled by a servo control system (not shown). The entire stage and vacuum system is mounted on a granite block (not shown) which in turn rides on air pads to minimize and dampen mechanical vibrations. The position of the stage is tracked by using a laser interferometer 260 such as the H-P 5501 dual axis laser interferometer. Positional accuracies of less than 0.1 $\mu$m are obtainable by this technique. The laser interferometer consists of a beam splitter, several reflectors, two receivers and associated electronics such that as the stage moves, the length of the path from laser to receiver varies linearly with stage travel in both X and Y. The stage can be moved to any position by subtracting the current stage position from the desired stage position to generate an error signal. Using the error signal, the stage can be driven to the desired position within an accuracy limited by the mechanical and electrical system properties since the laser resolution is on the order of 20 nm. Rotation and Z-motion may be obtained by conventional means.

Each aperture in the multi-aperture screen lens 160 functions as an electron lens and focuses an electron beam onto the resistcoated substrate 190 on the stage. The beams are blanked synchronously by means of quadrupole beam blanker 170. The blanker consists of four cylindrically symmetric electrodes mounted coaxially with the beam and located above the object aperture 150. By applying appropriate, adjustable DC and pulsed voltages to these plates, the beam may be selectively steered onto and removed from (blanked) the object aperture.

The octupole deflectors 220, 230 are usually used to linearly deflect all the electron beams in one direction while the interferometer stage moves in an orthogonal direction, thus effectively scanning out a predetermined area under each aperture of multi-aperture screen lens 160.

The stage is initially zeroed by observing a set of fiducial marks (not shown) arranged on the substrate 190 so that subsequent electron-optical imagery will be registered with respect to the patterns with accuracies of $\pm 0.1$ $\mu$m.

Substrate registration may be accomplished by scanning two or more electron beams, formed by the screen lens, over registration marks on the substrate. The registration marks may consist of a metal having a high atomic number or topographical features. Primary electrons scattered from these marks are detected and converted to electrical signals. The present means of detection consists of a scintillating material located above each registration mark, and the resulting optical signals from the scintillators are converted to electrical signals by means of photomultiplier tubes. The temporal relationship between the scanning beams and the resultant electrical signals may then be used to determine the substrate location. By repetitively moving the stage in the X, Y, Z and $\theta$ axes, the substrate may be brought into very precise alignment with the impinging beams.

Writing of the desired integrated circuit pattern is performed along one full axis of a chip while the stage is in continuous motion. When the stage reaches a point along its path where it is desired that writing be commenced, the interferometer emits a signal which leads to the unblanking of the beam and commencement of the deflection ramp. The deflected beam traverses a line, typically 100 $\mu$m long, during which it is blanked on and off as determined by the pattern data flow to the quadrupole blanker. The line is made normal to the motion of the stage by application of a small correction deflection ramp applied to the deflection axis parallel to the stage motion. At predetermined intervals of stage position, as determined by the laser interferometer, this process is repeated until a series of parallel lines forming an entire stripe of the circuit pattern is completed. The stage then moves back to its starting position, during which new circuit pattern data is loaded into the computer memory. At the same time, the stage is stepped over a distance equal to the line width and the process of writing another pattern stripe is repeated. These steps are continued until the entire circuit pattern is completed. Approximate deflection corrections in the X and Y directions are continuously made to correct for the stage motion during writing.

Before stage motion can be initiated, the desired stage acceleration, deceleration, velocity and desitination must be specified. An electro-mechanical velocity transducer (not shown) provides information to a velocity control servo loop (not shown), maintaining a speed uniformity of 0.5–1.0%.

The laser controlled interferometer stage is controlled by a general purpose computer (not shown) such as the Data General M/600.

Several alternative methods of simultaneous pattern generation on each die can be used with the same apparatus of FIG. 1, requiring only different control sequences for the electron beam and the stage. In one of these the target is kept still while each electron beam is made to describe a series of parallel lines by deflecting the electron beam sequentially in two orthogonal directions in the so-called raster scan mode. In this way a small square area with sides equal to the length of one line is covered with a set of equally spaced lines. The pattern is generated by blanking as previously. The target is then moved by the laser controlled stage to such a position that the next small square has one side adjacent to one side of the first small square. The process is then repeated until the whole area of each individual die is written upon with a predetermined pattern. Alternatively, while the target is kept still, each unblanked beam may be simultaneously deflected in two orthogonal directions so that the focused spot of each electron beam writes a predetermined pattern over a small square in the so-called vector scan mode. The target is then moved as before to such a position that a second small square can be written upon, by each electron beam and the process is repeated until each die has a complete pattern written upon it. Yet other arrangements are possible in the system of FIG. 1. For example, if cathode 110 is made to be an ion rather than electron source, and an ion-sensitive resist is used for coating 200, the multiple ion images on the pattern in object aperture 150 are produced on coating 200 by the multi-aperture screen lens 160. Since the system of FIG. 1 is wholly electrostatic, the paths taken by the ions are identical to those traversed by the electrons; the ions just travel those trajectories at lower velocities. Positive ions, of course, require that the signs of the voltages applied by medium-voltage power supply 100 and high-voltage power supply 180 be reversed.

If desired, patterns can be etched into the substrate 190 directly, without exposing a resist layer and later developing it. This is done by using the ion beam to sputter away the substrate material. Hence, micromachining of thin films can be done directly and arrays of devices produced in conjunction with a single object aperture 150. Even more importantly, such an arrangement can be used for producing arrays of ion-implanted semi-conductor devices by applying from high-voltage power supply 180 a voltage on the order of 20–100 kv. in order to obtain deep penetration of the ions in the substrate 190, and adjusting the medium voltage supply 100 approximately to keep the beam in focus.

It is clear that the above description of the preferred embodiment in no way limits the scope of the present invention which is defined by the following claims.

What is claimed is:
1. A multiple image exposure system comprising:
   (a) an exposure beam directed along a path;
   (b) means for selectively blanking said exposure beam;
   (c) screen lens means placed in the path of said exposure beam and having a multiplicity of openings formed therein simultaneously illuminated by said exposure beam, each of said openings of said screen lens means acting as a lens for focusing a demagnified image of said exposure beam onto a target surface positioned adjacent said screen lens means;
   (d) deflection means comprising a plurality of octupole deflectors sequentially disposed along the path of said exposure beam between said blanking means and said screen lens means for controllably deflecting said exposure beam in a predetermined manner and thereby controlling the deflection of the multiplicity of demagnified images of said exposure beam being focused onto said target surface; and
   (e) means for applying predetermined voltages to said octupole deflectors to tailor the shape of said octupole deflectors' electric fields so that the deflection trajectories of particles comprising said exposure beam reaching said screen lens means are uniform;
   (f) means for moving said target surface.
2. A multiple image exposure system as recited in claim 1 wherein said exposure beam comprises an electron beam and said target surface comprises an electron-sensitive resist coating on a substrate.
3. A multiple image exposure system as recited in claim 1 wherein said exposure beam comprises an ion beam and said target surface comprises an ion-sensitive resist coating on a substrate.
4. A multiple image exposure system as recited in claim 1 wherein said exposure beam comprises an ion beam and said target surface comprises a semiconductor material adapted to be doped by said ion beam.
5. A multiple exposure system as recited in claim 1 wherein said exposure beam comprises an ion beam and said target surface comprises a substrate adapted to be sputtered away by said ion beam.
6. A multiple image exposure system comprising:
   (a) an exposure beam directed along a path;
   (b) means for selectively blanking said exposure beam;
   (c) screen lens means placed in the path of said exposure beam and having a multiplicity of openings formed therein simultaneously illuminated by said exposure beam, each of said openings of said screen lens means acting as a lens for focusing a demagnified image of said exposure beam onto a target surface positioned adjacent said screen lens means;
   (d) deflection means comprising at least two octupole deflectors sequentially disposed along the path of said exposure beam between said blanking means and said screen lens means for controllably deflecting said exposure beam in a predetermined manner and thereby controlling the deflection of the multi- plicity of demagnified images of said exposure beam being focused onto said target surface;

(e) means for applying predetermined voltages to said octupole deflectors to tailor the shape of said octupole deflectors' electric fields so that the deflection trajectories of particles comprising said exposure beam reaching said screen lens means are uniform; and (f) means for moving said target surface.

7. A multiple image exposure system as recited in claim 6 wherein said exposure beam comprises an electron beam and said target surface comprises an electron-ensitive resist coating on a substrate.

8. A multiple image exposure system as recited in claim 6 wherein said exposure beam comprises an ion beam and said target surface comprises an ion-sensitive resist coating on a substrate.

9. A multiple image exposure system as recited in claim 6 wherein said exposure beam comprises an ion beam and said target surface comprises a semiconductor material adapted to be doped by said ion beam.

10. A multiple exposure system as recited in claim 6 wherein said exposure beam comprises an ion beam and said target surface comprises a substrate adapted to be sputtered away by said ion beam.

11. A multiple image exposure system comprising:
(a) an exposure beam directed along a path;
(b) means for selectively blanking said exposure beam;
(c) beam profile means having a predetermined aperture pattern therein and placed in the path of said exposure beam;
(d) screen lens means placed in the path of said exposure beam and spaced from said beam profile means, said screen lens means having a multiplicity of openings formed therein simultaneously illuminated by said exposure beam, each of said openings of said screen lens means acting as a lens for focusing a demagnified image of said predetermined aperture pattern onto a target surface positioned adjacent said screen lens means;
(e) deflection means comprising a pair of octupole deflectors sequentially disposed along the path of said exposure beam between said beam profile means and said screen lens means for controllably deflecting said exposure beam in a first direction and thereby controlling the deflection of the multiplicity of demagnified images of said predetermined aperture pattern being focused onto said target surface;
(f) means for applying predetermined voltages to said octupole deflectors to tailor the shape of said octupole deflectors' electric fields so that the deflection trajectories of particles comprising said exposure beam reaching said screen lens means are uniform; and
(g) means for moving said target surface in a second direction.

12. A multiple image exposure system as recited in claim 11 wherein said exposure beam comprises an electron beam and said target surface comprises an electron-sensitive resist coating on a substrate.

13. A multiple image exposure system as recited in claim 11 wherein said exposure beam comprises an ion beam and said target surface comprises an ion-sensitive resist coating on a substrate.

14. A multiple image exposure system as recited in claim 11 wherein said exposure beam comprises an ion beam and said target surface comprises a semiconductor material adapted to be doped by said ion beam.

15. A multiple exposure system as recited in claim 11 wherein said exposure beam comprises an ion beam and said target surface comprises a substrate adapted to be sputtered away by said ion beam.

16. A multiple image exposure system comprising:
(a) an exposure beam directed along a path;
(b) means for selectively blanking said exposure beam;
(c) beam profile means having a predetermined aperture pattern therein and placed in the path of said exposure beam;
(d) screen lens means placed in the path of said exposure beam and spaced from said beam profile means, said screen lens means having a multiplicity of openings formed therein simultaneously illuminated by said exposure beam, each of said openings of said screen lens means acting as a lens for focusing a demagnified image of said predetermined aperture pattern onto a target surface positioned adjacent said screen lens means;
(e) deflection means comprised of two octupole deflectors disposed along the path of said exposure beam between said beam profile means and said screen lens means for controllably deflecting said exposure beam along a straight line in a first direction and thereby controlling the deflection of the multiplicity of demagnified images of said predetermined aperture pattern being focused onto said target surface;
(f) means for applying predetermined voltages to said octupole deflectors to tailor the shape of said octupole deflectors' electric fields so that the deflection trajectories of particles comprising said exposure beam reaching said screen lens means are uniform; and
(g) means for moving said target surface in a second direction.

17. A multiple image exposure system as recited in claim 16 wherein said exposure beam comprises an electron beam and said target surface comprises an electron-sensitive resist coating on a substrate.

18. A multiple image exposure system as recited in claim 16 wherein said exposure beam comprises an ion beam and said target surface comprises an ion-sensitive resist coating on a substrate.

19. A multiple image exposure system as recited in claim 16 wherein said exposure beam comprises an ion beam and said target surface comprises a semiconductor material adapted to be doped by said ion beam.

20. A multiple exposure system as recited in claim 16 wherein said exposure beam comprises an ion beam and said target surface comprises a substrate adapted to be sputtered away by said ion beam.

21. A multiple image exposure system comprising:
(a) an exposure beam directed along a path;
(b) means for selectively blanking said exposure beam;
(c) beam profile means having a predetermined aperture pattern therein and placed in the path of said exposure beam;
(d) screen lens means placed in the path of said exposure beam and spaced from said beam profile means, said screen lens means having a multiplicity of openings formed therein simultaneously illuminated by said exposure beam, each of said openings of said screen lens means acting as a lens for focusing a demagnified image of said predetermined aperture pattern onto a target surface positioned adjacent said screen lens means;

(e) means for imaging said exposure beam on said screen lens means wherein said beam profile means is placed at the focus point of said imaging means;

(f) deflection means comprised of a pair of octupole deflectors disposed along the path of said exposure beam between said beam profile means and said screen lens means for controllably deflecting said exposure beam along a straight line in a first direction and thereby controlling the deflection of the multiplicity of demagnified images of said predetermined aperture pattern being focused onto said target surface;

(g) means for applying predetermined voltages to said octupole deflectors to tailor the shape of said octupole defflectors' electric fields so that the deflection trajectories of particles comprising said exposure beam reaching said screen lens means are uniform; and (h) means for moving said target surface in a second direction.

22. A multiple image exposure system as recited in claim 21 wherein said exposure beam comprises an electron beam and said target surface comprises an electron-sensitive resist coating on a substrate 23. A multiple image exposure system as recited in claim 21 wherein said exposure beam comprises an ion beam and said target surface comprises an ion-sensitive resist coating on a substrate.

24. A multiple image exposure system as recited in claim 21 wherein said exposure beam comprises an ion beam and said target surface comprises a semiconductor material adapted to be doped by said ion beam.

25. A multiple exposure system as recited in claim 21 wherein said exposure beam comprises an ion beam and said target surface comprises a substrate adapted to be sputtered away by said ion beam.

26. A multiple image exposure system comprising:
(a) an exposure beam directed along a path;
(b) means for selectively blanking said exposure beam;
(c) beam profile means having a square aperture pattern therein and placed in the path of said exposure beam;
(d) screen lens means placed in the path of said exposure beam and spaced from said beam profile means, said screen lens means having a multiplicity of openings formed therein simultaneously illuminated by said exposure beam, each of said openings of said screen lens means acting as a lens for focusing a demagnified image of said square aperture pattern onto a target surface positioned adjacent said screen lens means;
(e) lens means for imaging said exposure beam on said screen lens means wherein said beam profile means is placed at the focus point of said lens means;
(f) dual octupole deflection means disposed along the path of said exposure beam between said beam profile means and said screen lens means for controllably deflecting said exposure beam along a straight line in a first direction and thereby controlling the deflection of the multiplicity of demagnified images of said square aperture pattern being focused onto said target surface;
(g) means for applying predetermined voltages to said octupole deflectors to tailor the shape of said octupole deflectors' electric fields so that the deflection trajectories of particles comprising said exposure beam reaching said screen lens means are uniform; and
(h) means for moving said target surface in a direction substantially orthogonal to said first direction.

27. A multiple image exposure system as recited in claim 26 wherein said exposure beam comprises an electron beam and said target surface comprises an electron-sensitive resist coating on a substrate.

28. A multiple image exposure system as recited in claim 26 wherein said exposure beam comprises an ion beam and said target surface comprises an ion-sensitive resist coating on a substrate.

29. A multiple image exposure system as recited in claim 26 wherein said exposure beam comprises an ion beam and said target surface comprises a semiconductor material adapted to be doped by said ion beam.

30. A multiple exposure system as recited in claim 26 wherein said exposure beam comprises an ion beam and said target surface comprises a substrate adapted to be sputtered away by said ion beam.

31. A multiple image exposure system comprising:
(a) an electron beam directed along a path;
(b) quadrupole blanking means for selectively blanking said electron beam;
(c) beam profile means having a square aperture pattern therein and placed in the path of said electron beam;
(d) screen lens means placed in the path of said electron beam and spaced from said beam profile means, said screen lens means having a multiplicity of openings formed therein simultaneously illuminated by said electron beam, each of said openings of said screen lens means acts as a lens for focusing a demagnified image of said square aperture pattern onto a target surface positioned adjacent said screen lens means and comprising an electron-sensitive resist coating on a substrate;
(e) lens means for imaging said electron beam on said screen lens means wherein said beam profile means is placed at the focus point of said lens means;
(f) dual octupole deflection means disposed along the path of said electron beam between said beam profile means and said screen lens means for controllably deflecting said electron beam along a straight line in a first direction and thereby controlling the deflection of the multiplicity of demagnified images of said square aperture pattern being focused onto said target surface;
(g) means for applying predetermined voltages to said dual octupole deflection means to tailor the shape of said deflection means' electric fields so that the deflection trajectories of particles comprising said exposure beam reaching said screen lens means are uniform; and
(h) means for moving said target surface in a direction substantially orthogonal to said first direction.

* * * * *